United States Patent
Chen et al.

(10) Patent No.: US 7,910,388 B2
(45) Date of Patent: Mar. 22, 2011

(54) SEMICONDUCTOR LIGHT-EMITTING DEVICE WITH SELECTIVELY FORMED BUFFER LAYER ON SUBSTRATE

(75) Inventors: Miin-Jang Chen, Taipei (TW);
Wen-Ching Hsu, Hsinchu (TW);
Suz-Hua Ho, Jhudong Township, Hsinchu County (TW)

(73) Assignees: Sino-American Silicon Products Inc., Hsinchu (TW); Miin-Jang Chen, Taipei (TW)

( * ) Notice: Subject to any disclaimer, the term of this patent is extended or adjusted under 35 U.S.C. 154(b) by 307 days.

(21) Appl. No.: 12/196,911

(22) Filed: Aug. 22, 2008

(65) Prior Publication Data
US 2009/0050914 A1    Feb. 26, 2009

(30) Foreign Application Priority Data
Aug. 24, 2007 (TW) ............................. 96131337 A

(51) Int. Cl.
*H01L 21/00* (2006.01)
(52) U.S. Cl. ............................... 438/34; 438/29; 257/94
(58) Field of Classification Search ................... 438/29, 438/34; 257/94
See application file for complete search history.

(56) References Cited

U.S. PATENT DOCUMENTS

| | | | | |
|---|---|---|---|---|
| 6,753,552 B1* | 6/2004 | Lan et al. | | 257/79 |
| 7,482,183 B2* | 1/2009 | Edmond et al. | | 438/22 |
| 2005/0236633 A1* | 10/2005 | Emerson | | 257/94 |
| 2007/0069225 A1* | 3/2007 | Krames et al. | | 257/94 |
| 2007/0085093 A1* | 4/2007 | Ohmae et al. | | 257/89 |
| 2009/0057700 A1* | 3/2009 | Jin et al. | | 257/98 |

* cited by examiner

*Primary Examiner* — Fernando L Toledo

(57) ABSTRACT

The invention discloses a semiconductor light-emitting device and a method of fabricating the same. The semiconductor light-emitting device according to the invention includes a substrate, a buffer layer, a multi-layer structure, and an ohmic electrode structure. The buffer layer is selectively formed on an upper surface of the substrate such that the upper surface of the substrate is partially exposed. The multi-layer structure is formed to overlay the buffer layer and the exposed upper surface of the substrate. The multi-layer structure includes a light-emitting region. The buffer layer assists a bottom-most layer of the multi-layer structure in lateral and vertical epitaxial growth. The ohmic electrode structure is formed on the multi-layer structure.

15 Claims, 6 Drawing Sheets

SEMICONDUCTOR LIGHT-EMITTING DEVICE WITH SELECTIVELY FORMED BUFFER LAYER ON SUBSTRATE

BACKGROUND OF THE INVENTION

1. Field of the Invention

The present invention relates to a semiconductor light-emitting device and, more particularly, to a semiconductor light-emitting device with an enhanced external quantum efficiency and a good epitaxy quality.

2. Description of the Prior Art

The current semiconductor light-emitting devices, such as light-emitting diodes, have been used for a wide variety of applications, e.g. illuminations and remote controls. To ensure high functional reliability as great as possible and a low power requirement of the semiconductor light-emitting devices, the external quantum efficiency is required for the devices.

In principle, the external quantum efficiency of a semiconductor light-emitting device is determined both by the internal quantum efficiency and extraction efficiency. The internal quantum efficiency is determined by the material property and quality. The extraction efficiency refers to the proportion of radiation emitted from the interior of the device into the surrounding air or encapsulating epoxy. The extraction efficiency is determined by the losses occurred when radiation leaves the interior of the device. One of the main causes for such losses is the high refractive index of the semiconductor material so the radiation cannot be emitted outside at the semiconductor surface on account of total reflection.

Please refer to FIG. 1. To enhance the external quantum efficiency of the semiconductor light-emitting device, a sapphire substrate 1 with a patterned surface 10 has been disclosed and applied to the manufacture of the semiconductor light-emitting device. FIG. 1 illustrates a schematic view of a conventional sapphire substrate 1 with a patterned surface 10. The patterned surface 10 is for scattering light emitted out from the semiconductor light-emitting device to reduce the probability of a total reflection, and further to enhance the external quantum efficiency of the semiconductor light-emitting device.

Although a semiconductor material layer, e.g. a GaN layer, can be formed on the patterned surface 10 of the sapphire substrate 1 through a good lateral epitaxial growth, the GaN layer can not be grown on the patterned surface 10 of the sapphire substrate 1 directly, i.e. a poor vertical epitaxial growth. Therefore, the quality of the GaN semiconductor material layer formed on the patterned surface 10 of the sapphire substrate 1 is still required for improvement.

Inside the semiconductor light-emitting device of the prior art, a buffer layer can be formed between a semiconductor material layer and an ordinary substrate to improve the quality of the semiconductor material layer. As a result, the external quantum efficiency of the semiconductor light-emitting device will further be enhanced by the buffer layer.

Accordingly, the main scope of the invention is to provide a semiconductor light-emitting device with an enhanced external quantum efficiency and a good epitaxy quality.

SUMMARY OF THE INVENTION

One scope of the invention is to provide a semiconductor light-emitting device and a fabricating method thereof.

According to an embodiment of the invention, the semiconductor light-emitting device includes a substrate, a buffer layer, a multi-layer structure, and an ohmic electrode structure.

The buffer layer is selectively formed on an upper surface of the substrate such that the upper surface of the substrate is partially exposed. The multi-layer structure is formed to overlay the buffer layer and the exposed upper surface of the substrate. The multi-layer structure includes a light-emitting region. The buffer layer is formed to assist a bottom-most layer of the multi-layer structure in lateral and vertical epitaxial growth. The ohmic electrode structure is formed on the multi-layer structure.

According to another embodiment of the invention, it is related to a method of fabricating a semiconductor light-emitting device.

First, a substrate is prepared. Subsequently, a buffer layer is formed on an upper surface of the substrate selectively such the upper surface of the substrate is partially exposed. Then, a multi-layer structure is formed to overlay the buffer layer and the exposed upper surface of the substrate. The multi-layer structure includes a light-emitting region, and the buffer layer is formed to assist a bottom-most layer of the multi-layer structure in lateral and vertical epitaxial growth. Finally, an ohmic electrode structure is formed on the multi-layer structure.

Compared to the prior art, the buffer layer of the semiconductor light-emitting device according to the invention is selectively formed on the substrate and is for scattering light emitted from the semiconductor light-emitting device to reduce the total reflection and further enhance the external quantum efficiency of the semiconductor light-emitting device. Furthermore, the buffer layer can assist a bottom-most layer of the multi-layer structure in lateral and vertical epitaxial growth to increase the epitaxy quality of the semiconductor light-emitting device.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
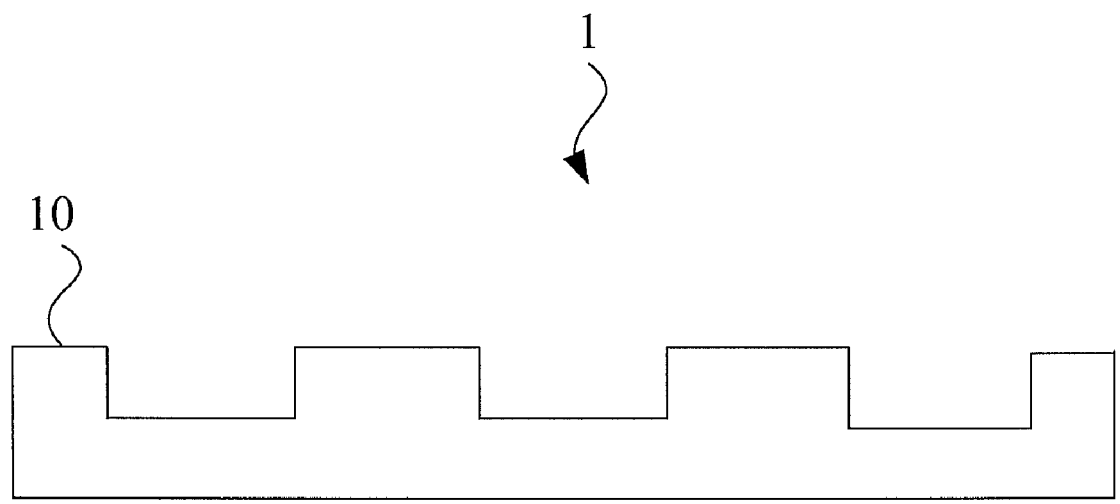
FIG. 1 illustrates a schematic view of a conventional sapphire substrate with a patterned surface.
Figure 2:
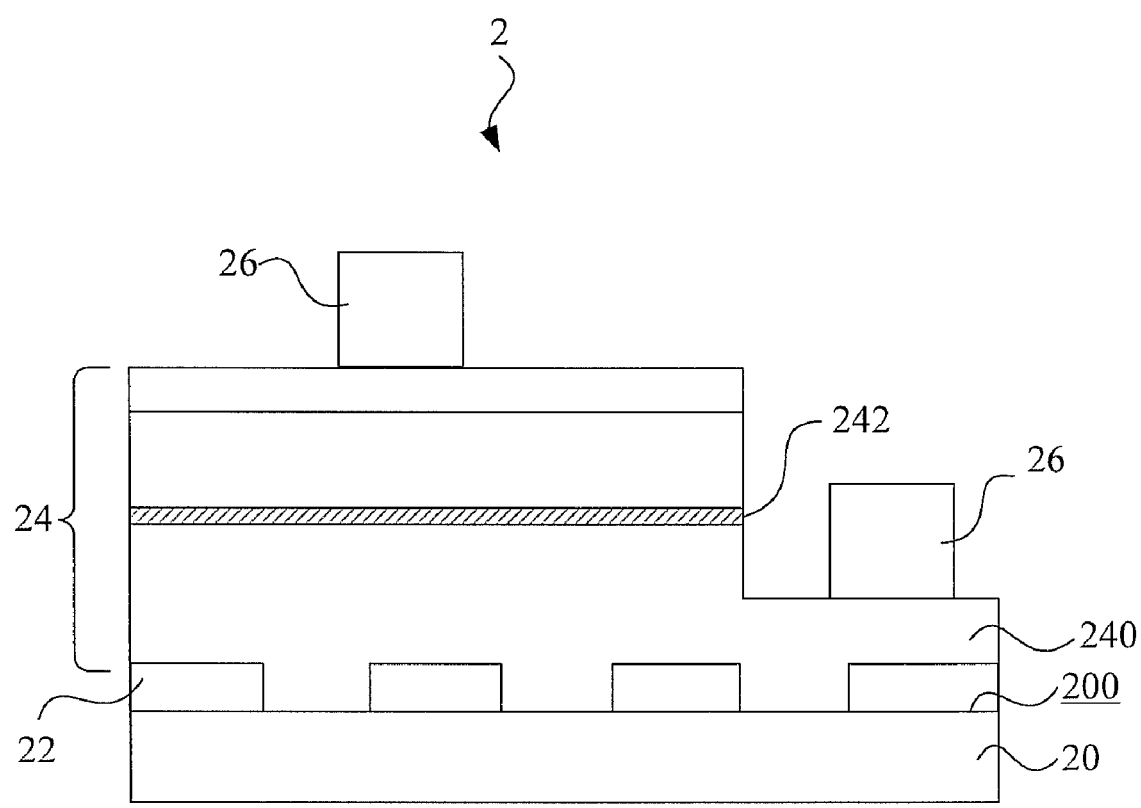
FIG. 2 illustrates a sectional view of a semiconductor light-emitting device according to an embodiment of the invention.

Please refer to FIG. 2. FIG. 2 illustrates a sectional view of a semiconductor light-emitting device 2 according to an embodiment of the invention. As shown in FIG. 2, the semiconductor light-emitting device 2 includes a substrate 20, a buffer layer 22, a multi-layer structure 24, and an ohmic electrode structure 26.

In practical applications, the substrate 20 can be made of sapphire, Si, SiC, GaN, ZnO, $ScAlMgO_4$, YSZ (Yttria-Stabilized Zirconia), $SrCu_2O_2$, $LiGaO_2$, $LiAlO_2$, GaAs and the like.

The buffer layer 22 is selectively formed on an upper surface 200 of the substrate 20 such that the upper surface 200 of the substrate 20 is partially exposed. The multi-layer structure 24 is formed to overlay the buffer layer 22 and the exposed upper surface 200 of the substrate 20. The multi-layer structure 24 includes a light-emitting region 242. The buffer layer 22 is formed to assist a bottom-most layer 240 of the multi-layer structure 24 in lateral and vertical epitaxial growth. In one embodiment, the bottom-most layer 240 can be made of GaN. The ohmic electrode structure 26 is formed on the multi-layer structure 24.

In practical applications, the buffer layer 22 can be made of ZnO, $Mg_xZn_{1-x}O$, AlN or $Al_2O_3$, where $0<x\leq1$. In addition, the buffer layer 22 can have a thickness in a range of 10 nm to 500 nm.

If the buffer layer 22 is made of ZnO, the precursors of the ZnO buffer layer 22 can be $ZnCl_2$, $ZnMe_2$, $ZnEt_2$, and $H_2O$, $O_3$, $O_2$ plasma, or an oxygen radical. If the buffer layer 22 is made of $Mg_xZn_{1-x}O$, the precursors of the $Mg_xZn_{1-x}O$ buffer layer 22 can be $ZnCl_2$, $ZnMe_2$, $ZnEt_2$, $MgCp_2$, $Mg(thd)_2$, and $H_2O$, $O_3$, $O_2$ plasma, or an oxygen radical. If the buffer layer 22 is made of AlN, the precursors of the AlN buffer layer 22 can be $NH_3$ and $AlCl_3$, $AlMe_3$, $AlEt_3$, $Me_3N:AlH_3$, or $Me_2EtN:AlH_3$. If the buffer layer 22 is made of $Al_2O_3$, the precursors of the $Al_2O_3$ buffer layer 22 can be the precursors of $Al_2O_3$ are $AlCl_3$, $AlBr_3$, $AlMe_3$, $AlEt_3$, and $H_2O$, $O_3$, $O_2$ plasma, or an oxygen radical.

In one embodiment, the buffer layer 22 can be formed by an atomic layer deposition process and/or a plasma-enhanced (or a plasma-assisted) atomic layer deposition process. Moreover, the formation of the buffer layer 22 can be performed at a processing temperature ranging from room temperature to 1200° C. Further, the buffer layer 22 can be annealed at a temperature ranging from 400° C. to 1200° C. In another embodiment, the formation of the buffer layer 22 can be through a selective etching process.

Please refer to FIGS. 3A through 3I. FIGS. 3A through 3I illustrate sectional views to describe a method of fabricating a semiconductor light-emitting device according to another embodiment of the invention.

Figure 3A:
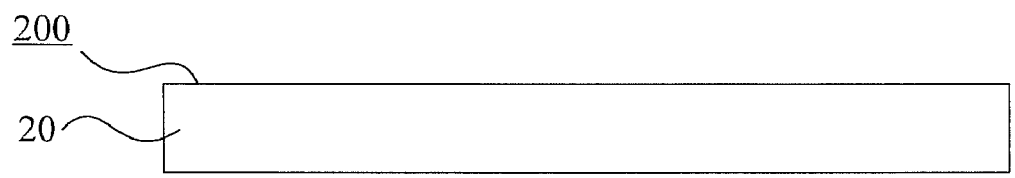
FIGS. 3A through 3I illustrate sectional views to describe a method of fabricating a semiconductor light-emitting device according to another embodiment of the invention.
Figure 3B:
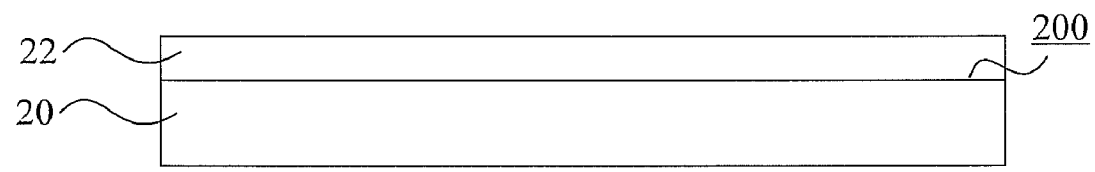
Figure 3C:
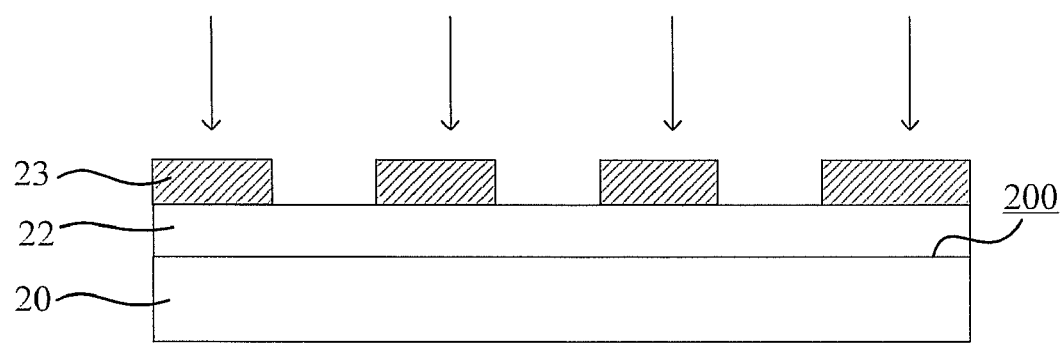
Figure 3D:
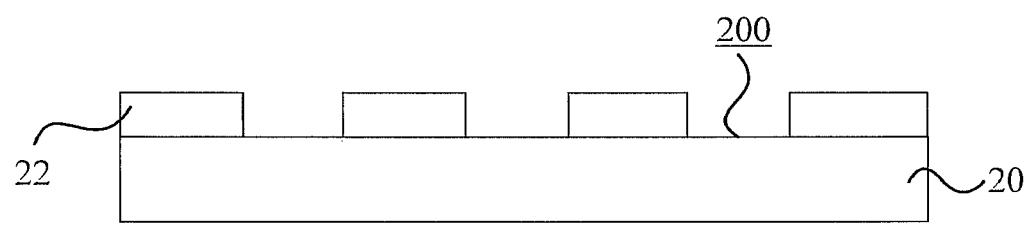

First, a substrate 20 is prepared, as shown in FIG. 3A. Subsequently, as shown in FIG. 3B, a buffer layer 22 can be formed on an upper surface 200 of the substrate 20 by an atomic layer deposition process in one embodiment. Then, an etching-resistant layer (e.g. a photoresist layer) 23 can be selectively formed on the surface of the buffer layer 22 as shown in FIG. 3C, and a selective etching process is performed on the surface of the buffer layer 22. Accordingly, the buffer layer 22 can be selectively formed on the upper surface 200 of the substrate 20 such that the upper surface 200 of the substrate 20 is partially exposed, as shown in FIG. 3D.

Figure 3E:
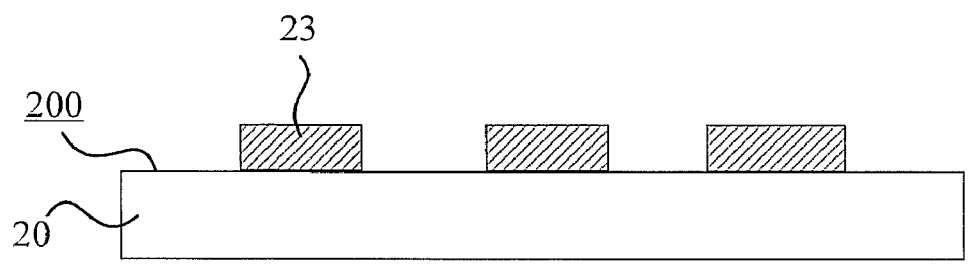
Figure 3F:
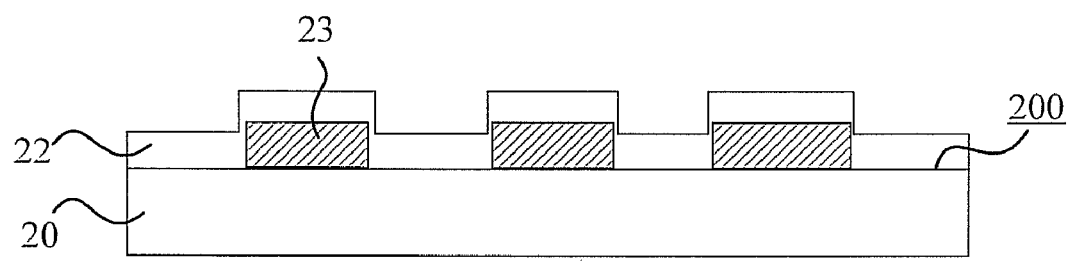
Figure 3G:
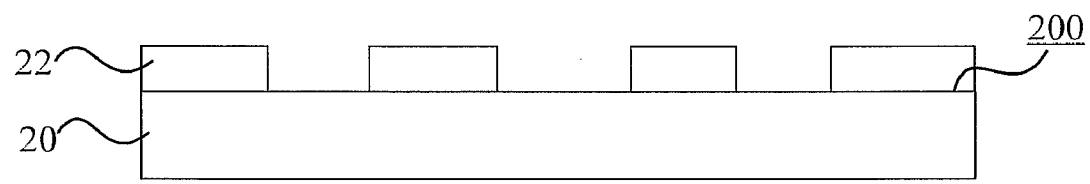

In another embodiment, an etching-resistant layer (e.g. a photoresist layer) 23 can be formed on the upper surface 200 of the substrate 20, as shown in FIG. 3E. Next, a buffer layer 22 can be formed on the upper surface 200 of the substrate 20 by an atomic layer deposition process and/or a plasma-enhanced (or a plasma-assisted) atomic layer deposition process, as shown in FIG. 3F. Then, a lift-off process can be implemented to remove the etching-resistant layer 23 to selectively form the buffer layer 22 on the upper surface 200 of the substrate 20 such that the upper surface 200 of the substrate 20 is partially exposed, as shown in FIG. 3G.

Figure 3H:
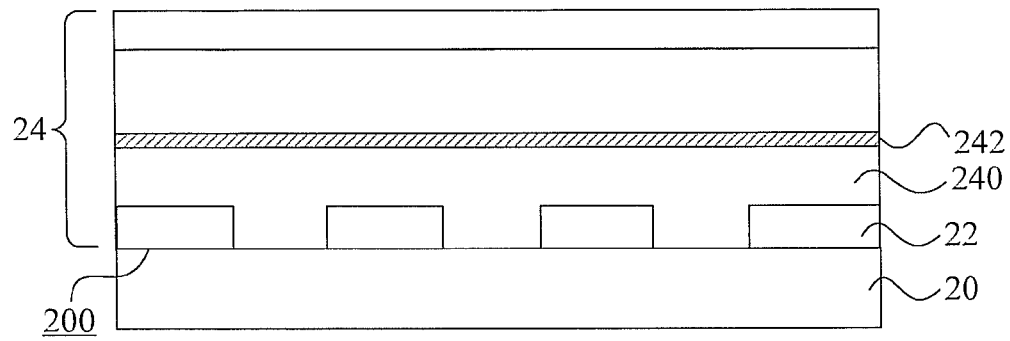
Figure 3I:
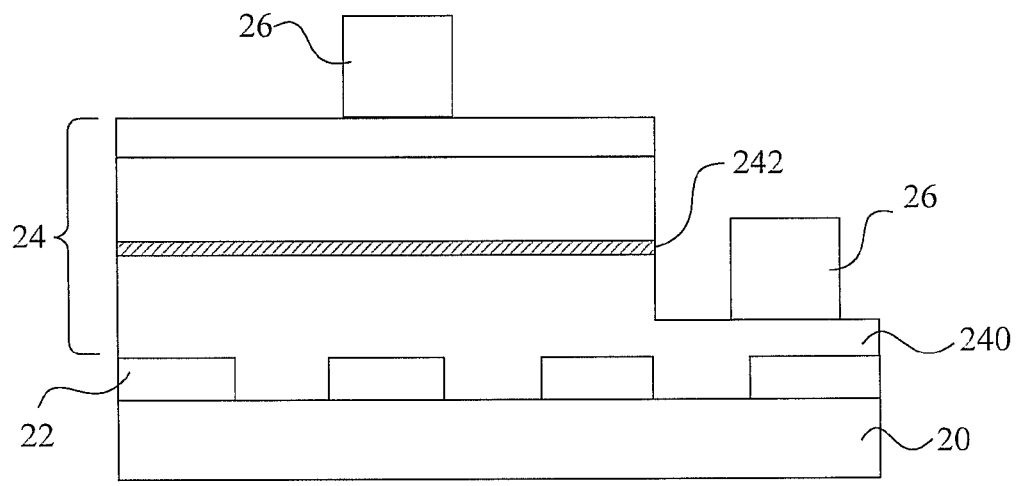

Subsequently, a multi-layer structure 24 is formed to overlay the buffer layer 22 and the exposed upper surface 200 of the substrate 20, as shown in FIG. 3H. The multi-layer structure 24 includes a light-emitting region 242, and the buffer layer 22 is formed to assist a bottom-most layer 240 of the multi-layer structure 24 in lateral and vertical epitaxial growth. Finally, the multi-layer structure 24 can be selectively etched, and then an ohmic electrode structure 26 is formed on the multi-layer structure 24, as shown in FIG. 3I.

Compared to the prior art, the buffer layer of the semiconductor light-emitting device according to the invention is selectively formed on the substrate and for scattering light emitted from the semiconductor light-emitting device to reduce the total reflection and further enhance the external quantum efficiency of the semiconductor light-emitting device. Furthermore, the buffer layer can assist a bottom-most layer of the multi-layer structure in lateral and vertical epitaxial growth to increase the epitaxy quality of the semiconductor light-emitting device.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device, comprising:
   a substrate;
   a buffer layer, selectively formed on an upper surface of the substrate such that the upper surface of the substrate is partially exposed, wherein the buffer layer is made of a material selected from the group consisting of ZnO, $Mg_xZn_{1-x}O$ and $Al_2O_3$, where $0<x\leq1$;
   a multi-layer structure, formed to overlay the buffer layer and the exposed upper surface of the substrate, the multi-layer structure comprising a light-emitting region, wherein the buffer layer assists a bottom-most layer of the multi-layer structure in lateral and vertical epitaxial growth; and
   an ohmic electrode structure, formed on the multi-layer structure.

2. The semiconductor light-emitting device of claim 1, wherein the bottom-most layer is made of GaN.

3. The semiconductor light-emitting device of claim 1, wherein the buffer layer has a thickness in a range of 10 nm to 500 nm.

4. The semiconductor light-emitting device of claim 1, wherein the substrate is made of a material selected from the group consisting of sapphire, Si, SiC, GaN, ZnO, $ScAlMgO_4$, YSZ (Yttria-Stabilized Zirconia), $SrCu_2O_2$, $LiGaO_2$, $LiAlO_2$, and GaAs.

5. A method of fabricating a semiconductor light-emitting device, comprising the steps of:
   preparing a substrate;
   by an atomic layer deposition process and/or a plasma-enhanced (or a plasma-assisted) atomic layer deposition process, selectively forming a buffer layer on an upper surface of the substrate such the upper surface of the substrate is partially exposed, wherein the buffer layer is made of a material selected from the group consisting of ZnO, $Mg_xZn_{1-x}O$, and $Al_2O_3$, where $0<x\leq1$;
   forming a multi-layer structure to overlay the buffer layer and the exposed upper surface of the substrate, wherein the multi-layer structure comprises a light-emitting region, and the buffer layer assists a bottom-most layer of the multi-layer structure in lateral and vertical epitaxial growth; and
   forming an ohmic electrode structure on the multi-layer structure.

6. The method of claim 5, wherein the bottom-most layer is made of GaN.

7. The method of claim 5, wherein the buffer layer has a thickness in a range of 10 nm to 500 nm.

8. The method of claim 5, wherein the formation of the buffer layer is through a selective etching process.

9. The method of claim 5, wherein the formation of the buffer layer is performed at a processing temperature ranging from room temperature to 1200° C.

10. The method of claim 9, wherein the buffer layer is further annealed at a temperature ranging from 400° C. to 1200° C. after formed.

11. The method of claim 9, wherein the precursors of the buffer layer of ZnO are $ZnCl_2$, $ZnMe_2$, $ZnEt_2$, and $H_2O$, $O_3$, $O_2$ plasma, or an oxygen radical.

12. The method of claim 9, wherein the precursors of the buffer layer of $Mg_xZn_{1-x}O$ are $ZnCl_2$, $ZnMe_2$, $ZnEt_2$, $MgCp_2$, $Mg(thd)_2$, and $H_2O$, $O_3$, $O_2$ plasma, or an oxygen radical.

13. The method of claim 9, wherein the precursors of AlN are $NH_3$ and $AlCl_3$, $AlMe_3$, $AlEt_3$, $Me_3N{:}AlH_3$, or $Me_2EtN{:}AlH_3$.

14. The method of claim 9, wherein the precursors of $Al_2O_3$ are $AlCl_3$, $AlBr_3$, $AlMe_3$, $AlEt_3$, and $H_2O$, $O_3$, $O_2$ plasma, or an oxygen radical.

15. The method of claim 5, wherein the substrate is made of a material selected from the group consisting of sapphire, Si, SiC, GaN, ZnO, $ScAlMgO_4$, YSZ (Yttria-Stabilized Zirconia), $SrCu_2O_2$, $LiGaO_2$, $LiAlO_2$, and GaAs.

* * * * *